United States Patent [19]

Donoghue

[11] Patent Number: 4,636,979
[45] Date of Patent: Jan. 13, 1987

[54] ORIENTATION OF REFERENCE CELLS IN A MEMORY

[75] Inventor: William J. Donoghue, Round Rock, Tex.

[73] Assignee: Motorola, Inc., Schaumburg, Ill.

[21] Appl. No.: 667,943

[22] Filed: Nov. 2, 1984

[51] Int. Cl.[4] .................................. G11C 17/00
[52] U.S. Cl. ............................. 365/104; 365/210
[58] Field of Search ............... 365/94, 104, 210, 200

[56] References Cited

U.S. PATENT DOCUMENTS 4,094,008  6/1978  Lockwood et al. ............ 365/149
4,415,992  11/1983  Adlhoch ........................ 365/94
4,546,453  10/1985  Noufer .......................... 365/104

Primary Examiner—Joseph A. Popek
Attorney, Agent, or Firm—John A. Fisher; Jeffrey Van Myers; James L. Clingan, Jr.

[57] ABSTRACT

A memory which has memory cells with first and second orientations also has reference cells with first and second orientations. When a memory cell with the first orientation is selected, an output of a reference cell with the first orientation is compared to that of the selected cell with the first orientation. When a memory cell with the second orientation is selected, an output of a reference cell with the second orientation is compared to that of the selected cell with the second orientation.

12 Claims, 12 Drawing Figures

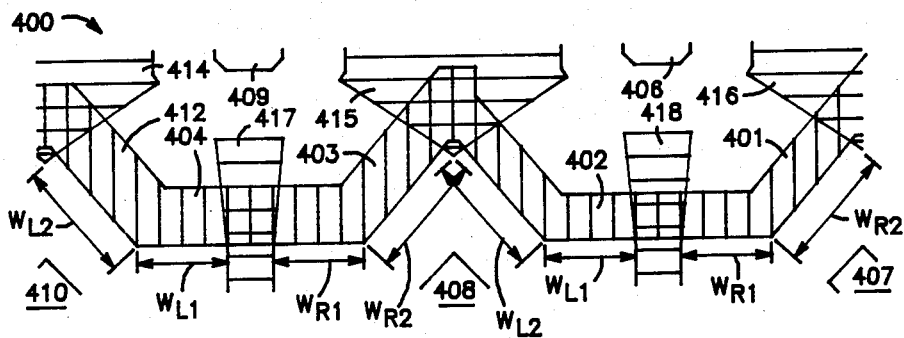
FIG. 4
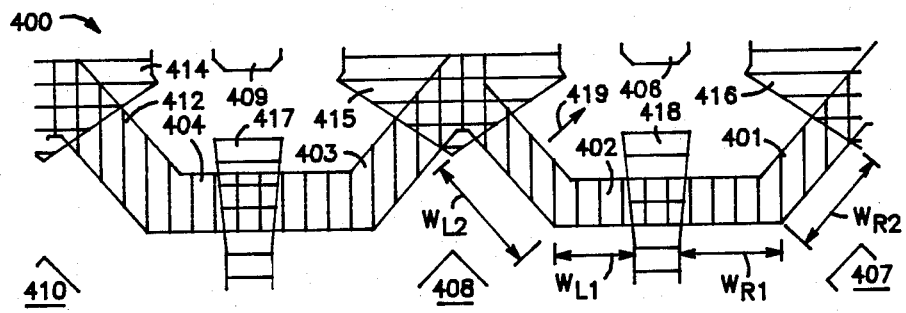
FIG. 5
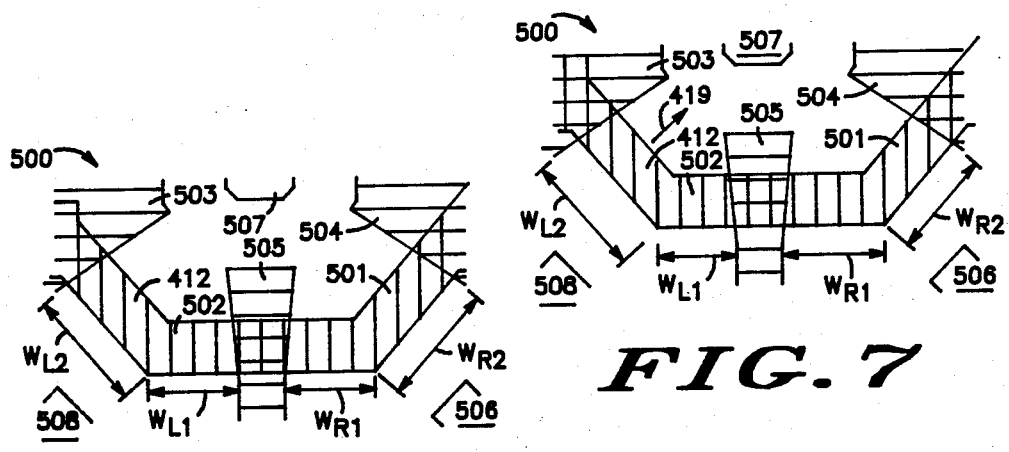
FIG. 6
FIG. 7

ORIENTATION OF REFERENCE CELLS IN A MEMORY

CROSS-REFERENCE TO RELATED APPLICATION

Related subject is disclosed in U.S. patent application Ser. No. 391,031 entitled "Four-State ROM Cell With Increased Gain Differential Between States", filed June 22, 1982, and assigned to the designee hereof, now U.S. Pat. No. 4,546,453.

FIELD OF THE INVENTION

The subject invention relates to memories, and more particularly to memories which use reference cells for sensing.

BACKGROUND OF THE INVENTION

In integrated circuit memories, reference cells have been found useful for sensing the state of a selected memory cell by using a comparator circuit. A reference cell is designed to provide a voltage signal which is between voltage levels of different states of a memory cell. The signal provided by the reference cell is compared to that provided by the selected memory cell to determine the state of the memory cell. An advantage of the reference cell technique of sensing is that the reference cell experiences the same processing during the manufacturing process as does the memory cells. As the voltages provided by the memory cells change with process variation, so does the reference cell. Another positive effect of using reference cells has been tracking due to size variation. If the nominal channel length of a memory cell transistor is 2.0 microns, but the actual length is 1.8 microns, the reference cell will typically track the reduction in channel length. In a self-aligned MOS process, a polysilicon gate determines the channel length. Variations in the polysilicon dimensions for the memory cells will be tracked by the polysilicon dimensions of reference cell transistors.

Although reference cells have some advantages, there can be problems in matching variations which occur due to mask registration problems when memory cells vary in orientation. Mask registration variation causes, for example, variations in the spatial relationship of a polysilicon gate of a transistor and the field oxide which defines the active region of that transistor. Such problems can cause a memory transistor to increase in gain while decreasing the gain of the reference cell transistor. This causes the reference voltage to be closer to one of the states of the memory cell which thus makes detection more difficult.

SUMMARY OF THE INVENTION

An object of the invention is to provide a memory with improved reference cells.

Another object of the invention is to provide a memory with reduced sensing degradation due to mask registration variation.

Yet another object of the invention is to provide a memory with improved immunity to mask registration variation.

These and other objects of the invention are achieved in a memory in which each memory cell is programmed to one of at least two logic states and in which each memory cell has one of at least two orientations. The memory includes reference cells which have the same orientations as the memory cells. For each memory cell that is selected, a reference cell which has the same orientation as the selected memory cell is used to determine the state of the selected memory cell.

BRIEF DESCRIPTION OF THE DRAWINGS

FIG. 4 is a topographical view of a portion of an array of four state memory cells showing two different states;

FIG. 5 is a topographical view of the array of FIG. 6 showing the results of mask to mask alignment variation;

FIG. 6 is a topographical view of reference transistor cells according to the invention;

FIG. 7 is a topographical view of the reference transistor cells showing the results of mask to mask alignment variation according to the invention.

DESCRIPTION OF THE INVENTION

Figure 1A:
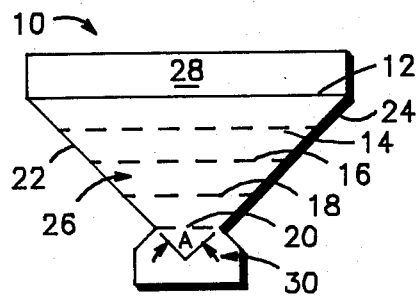
FIG. 1a is a topographical view of a memory cell showing four possible gain states.

Shown in FIG. 1a is a transistor memory cell 10 having four possible gain states, the selection of which is achieved by programming to one of four possible gate areas. The four gate areas are between an upper boundary 12 and one of a high gain line 14, a medium-high gain line 16, a medium-low gain line 18, and a low-gain line 20. The four gain states, in order of decreasing gain, comprise a high gain state, a medium-high gain state, a medium-low gain state, and a low gain state which correspond to gate areas bounded by high gain line 14, medium-high gain line 16, medium-low gain line 18, and a low gain line 20, respectively. Each gate area is also between a left boundary 22 and a right boundary 24. A total area available for making a gate is potential gate area 26 which is bounded by upper boundary 12, low gain line 20, left boundary 22, and right boundary 24. In this case potential gate area 26 is the same as the gate area for the low gain state because upper boundary 12, is a boundary for the gate area for each gain state. Left boundary 22 and right boundary 24 as shown are linearly tapered at an angle A from a drain region 28 to a source region 30. Regions 28 and 30 are designated drain and source respectively, for the likely current electrode function of the two regions but can in fact be interchanged so that either region can function as source or drain.

Figure 1B:
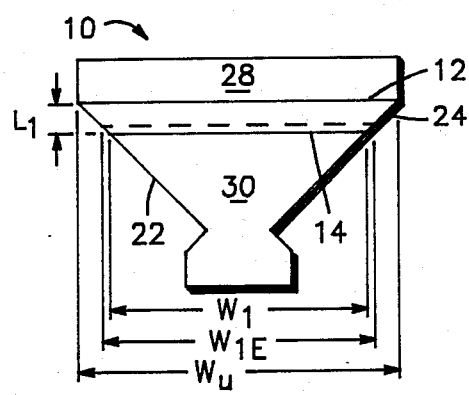
FIG. 1b is a topographical view of the memory cell of FIG. 1a in a high gain state.

FIG. 1b shows cell 10 in the high gain state with a gate area bounded by left boundary 22, right boundary 24, high gain line 14, and upper boundary 12, over which is applied polysilicon to form a gate. Dopant is then applied in a conventional self-aligning process forming a source and a drain in source and drain regions 30 and 28, respectively. Only a single mask for applying the polysilicon gate is required. Gain of a MOS transistor is directly related to the width to length ratio of the gate. Due to the tapering of the potential gate area toward source region 30, the high gain state cell shown in FIG. 1b does not have a uniform width. Instead, it has a long width $W_u$ at upper boundary 12 and a short width $W_1$ at high gain line 14. Experiment has shown that an effective width of a tapered gate is a function of the short and long widths, but is more heavily weighted toward the short width. For a linear taper as shown in FIG. 1a, an effective width $W_{1E}$ is located approximately three-fourths of the way from upper boundary 12 to high gain line 14 and the calculation for obtaining an approximation of effective gate width $W_{1E}$ is as follows:

$$W_{1E} = \frac{3W_1 + W_u}{4} \quad (1)$$

A gate length $L_1$ is measured from upper boundary 12 to high gain line 14. A gain $G_1$ of the high gain state is directly proportional to $W_{1E}/L_1$.

Figure 1C:
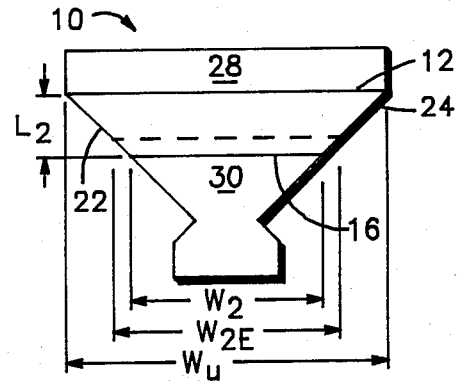
FIG. 1c is a topographical view of the memory cell of FIG. 1a in a medium-high gain state.

FIG. 1c shows cell 10 in a medium-high gain state with a gate area bounded by upper boundary 12, medium-high gain line 16, right boundary 24, and left boundary 22 over which is applied polysilicon to form a gate. Dopant is then applied in a conventional self-aligning process forming a source and a drain in source and drain regions 30 and 28, respectively. As in the high gain state depicted in FIG. 1b, only a single mask is required for applying the polysilicon gate. Because medium-high gain line 16 is further along the taper, the gate has a length $L_2$ which is longer than length $L_1$. An effective width $W_{1E}$ is related to long width $W_u$ and a short width $W_2$ by the following approximation:

$$W_{2E} = \frac{3W_2 + W_u}{4} \quad (2)$$

A gain $G_2$ of the medium-high gain state is directly proportional to $W_{2E}/L_2$. Gain $G_2$ is smaller than gain $G_1$ because effective gate width $W_{2E}$ and gate width $W_{1E}$ and length $L_2$ is greater than gate length $L_1$. So the gain differential between gains $G_1$ and $G_2$ is impacted not by just a difference in one of the gate length and width but by both a decrease in width and an increase in length to obtain the gain decrease.

Figure 1D:
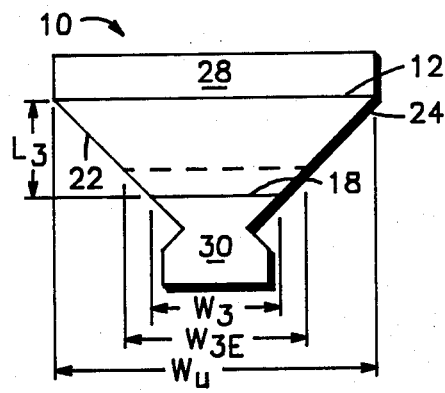
FIG. 1d is a topographical view of the memory cell of FIG. 1a in a medium-low gain state.

FIG. 1d shows cell 10 in a medium-low gain state with a gate area bounded by upper boundary 12, medium-low gain line 18, right boundary 24, and left boundary 22 over which is applied polysilicon to form a gate. Dopant is then applied in a conventional self-aligning process forming a source and a drain in source and drain regions 30 and 28, respectively. As in the high and medium-high gain states depicted in FIGS. 1b and 1c, respectively, only a single mask is required for applying the polysilicon gate. Because medium-low line 18, is further along the taper than medium-high line 16, the gate has a length $L_3$ which is longer than length $L_1$. An effective width $W_{3E}$ is related to long width $W_u$ and a short width $W_3$ by the following approximation:

$$W_{3E} = \frac{3W_3 + W_u}{4} \quad (3)$$

A gain $G_3$ of the medium-low gain state is directly proportional to $W_{3E}/L_3$. Gain $G_3$ is smaller than gain $G_2$ because effective gate width $W_{3E}$ is less than effective gate width $W_{2E}$ and gate length $L_3$ is greater than gate length $L_2$. So the gain differential between gains $G_3$ and $G_2$ is impacted not by just a difference in one of the gate length and width but by both a decrease in width and an increase in length to obtain the gain decrease.

Figure 1E:
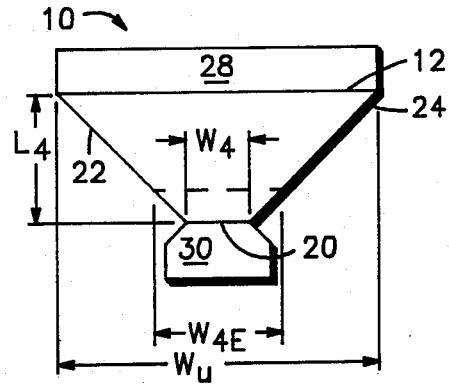
FIG. 1e is a topographical view of the memory cell of FIG. 1a in a low gain state.

FIG. 1e shows cell 10 in a low gain state with a gate area bounded by upper boundary 12, low gain line 20, right boundary 24, and left boundary 22 over which is applied polysilicon to form a gate. Dopant is then applied in a conventional self-aligning process forming a source and a drain in source and drain regions 30 and 28, respectively. As in the high, medium-high, and medium-low gain states depicted in FIGS. 1b, 1c, and 1d, respectively, only a single mask is required for applying the polysilicon gate. Because low gain line 20 is further along the taper than the medium-low line 18, the gate has a length $L_4$ which is longer than length $L_3$. An effective width $W_{4E}$ is related to long width $W_u$ and a short width $W_4$ by the following approximation:

$$W_{4E} = \frac{3W_4 + W_u}{4} \quad (4)$$

A gain $G_4$ of the low gain state is directly proportional to $W_{4E}/L_4$. Gain $G_4$ is smaller than gain $G_3$ because effective gate width $W_{4E}$ is less than effective gate width $W_{3E}$ and gate length $L_4$ is greater than gate length $L_3$. So the gain differential between gains $G_4$ and $G_3$ is impacted by both a decrease in width and an increase in length to obtain the gain decrease. Consequently, with a single program mask, any one of four unique gate areas are formed over potential gate area 26, and each unique gate area has an effective width and length which differ from the other gate areas.

Figure 2:
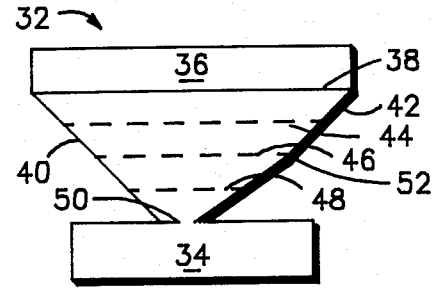
FIG. 2 is a topographical view of a memory cell having an accelerated taper showing four possible gain states.

Shown in FIG. 2 is a cell 32 which is substantially the same as cell 10 in FIG. 1a having a source region 34, a drain region 36, an upper boundary 38, a left boundary 40, a right boundary 42, and four gain lines 44, 46, 48, and 50 each for establishing a different gain state. The difference in cell 32 from cell 10 lies in a right boundary 42 which has a discontinuity at point 52 whereas the rate of taper of left and right boundaries 40 and 42 is accelerated. Left boundary 40 could be changed in shape as well but still taper with right boundary 42. Other possible shapes which could taper include but are not limited to curves and staircase shapes. Still other shapes may be used which allow for simultaneous variations in length and width of gate area may be selected, for example a hexagonal shape or a shape defined by a discontinuous curve or line.

Figure 3:
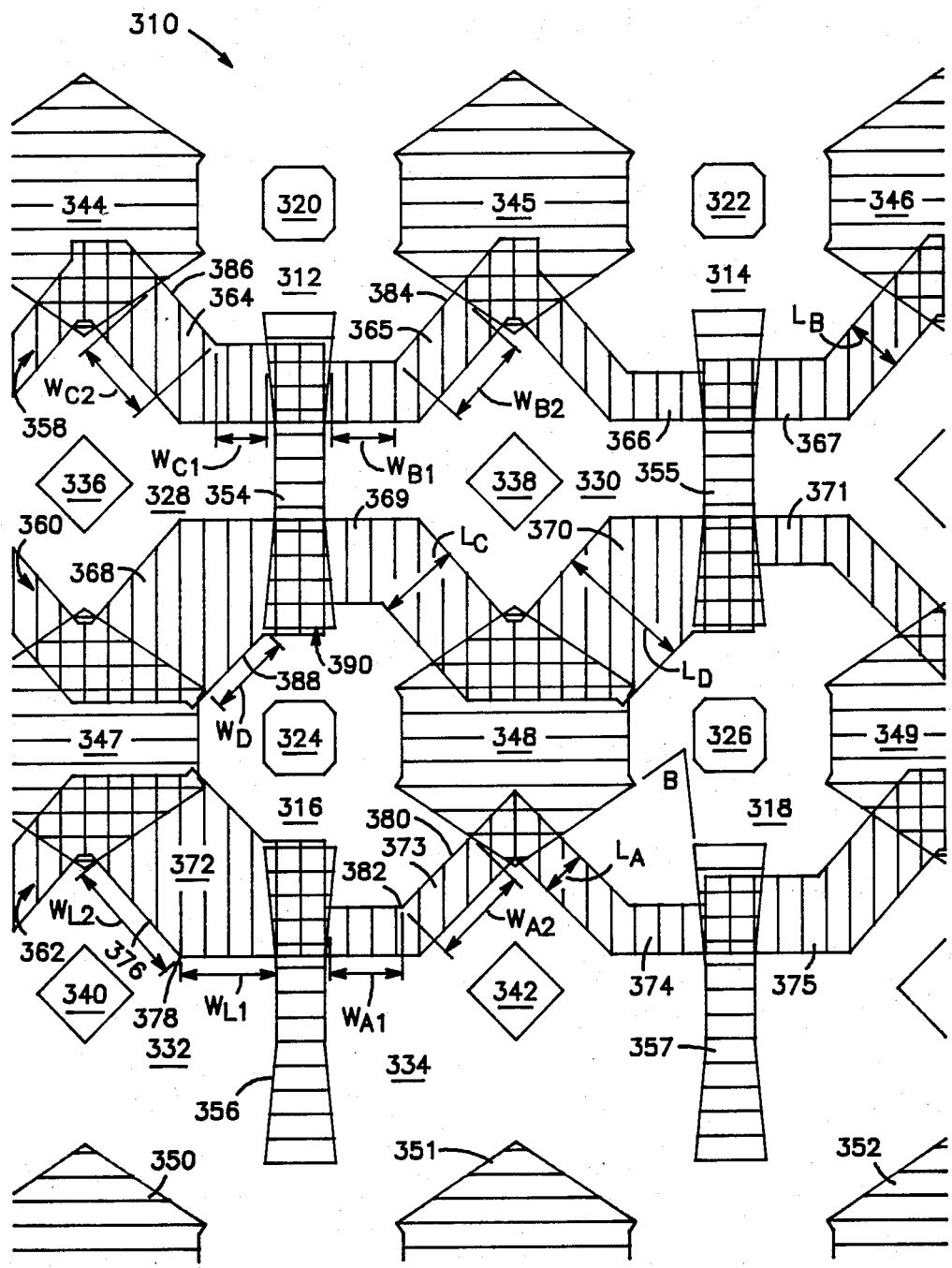
FIG. 3 is a topographical view of a portion of an array of four state memory cells.

Shown in FIG. 3 is a portion of a ROM cell array 310 which uses tapered potential gate areas to form transistor cells of four different gain states. Array 310 has four source regions 312, 314, 316, and 318 of N+ material with metal contacts 320, 322, 324, and 326, respectively, and four drain regions 328, 330, 332, and 334 of N+ material with metal contacts 336, 338, 340, and 342, respectively. Metal contacts 336 and 340 are for connecting drain regions 328 and 332 to a first metal bit sense line. Metal contacts 338 and 342 are for connection drain regions 330 and 334 to a second metal bit sense line. Metal contacts 320 and 324 are for connecting source regions 312 and 316 to a first metal virtual ground line. Metal contacts 322 and 326 are for connecting source regions 314 and 318 to a second metal virtual ground line.

To the left and right of each source region 312, 314, 316, and 318 are substantially diamond shaped regions of field oxide. Shown are oxide regions 344, 345, 346, 347, 348, 349, 350, 351 and 352. To the left and right of each drain region 328, 330, 332, and 334 are substantially bow-tie shaped regions of field oxide. Shown also are oxide regions 354, 355, 356, and 357. The location of oxide regions 344–352 and oxide regions 354–357 establish distinct paths between source regions 312, 314, 316 and 318 and drain regions 328, 330, 332, and 334 in a conventional X cell configuration. The shape, however, of oxide regions 344–352 and oxide regions 354–357 provide a unique taper which allows for formation of one of a high gain, a medium-high gain, a medium-low gain, and a low gain transistor cell between each source 312, 314, 316 and 318 and drain 328, 330, 332, and 334. Each path is tapered at an angle B. For example, the path formed by oxide regions 348 and 357 is tapered from drain region 334 to source region 318 at angle B. Transverse to each path between each source 312, 314, 316 and 318 and drain 328, 330, 332, and 334 is a channel region caused by rows of polysilicon in a conventional self-aligning gate process. Shown are 3 rows, 358, 360, and 362 of polysilicon. Shown are four gate areas 364, 365, 366, and 367 formed by row 358; four gate areas 368, 369, 370, and 371 formed by row 360; and four gate areas 372, 373, 374, and 375 formed by row 362. Each gate area 364–375 determines a transistor of one of high, medium-high, medium-low, and low gain.

For example, a high gain transistor is formed by gate area 373 between source region 316, and drain region 334. Other high gain transistors are formed by gate areas 366, 371, and 374 with the same dimensions as gate area 373. Each gate area 364–375 has a boundary adjacent a drain region and a boundary adjacent a source region. For example, gate area 372 has a drain boundary 376 adjacent drain region 332 and between diamond shaped oxide region 347 and bow-tie shaped oxide region 356. A portion of drain boundary 376 extends perpendicular to the longitudinal axis of oxide region 356 from oxide region 356 to a point 378 whereas drain boundary 376 changes direction by 45° to reach diamond shaped oxide 347. Gate area 372 has a drain boundary dimension from bow-tie shaped oxide 356 to point 378 of $W_{L1}$ and from point 378 to diamond shaped oxide region 347 of $W_{L2}$. Each gate area 364–375 has the same drain boundary dimensions of $W_{L1}$ and $W_{L2}$ the sum of which is a total drain boundary dimension of $W_L$. Consequently, the source boundary dimension correlates to the relative gain of the transistors formed by gate areas 364–375. For each gate area 364–375, the source boundary is parallel to the drain boundary.

A source boundary 380 of gate area 373 adjacent to source region 316 has a dimension $W_{A1}$ from oxide region 356 to a point 382 and a dimension $W_{A2}$ from point 382 to oxide 348. Each high gain gate area 366, 371, 373, and 374 have the same boundary dimensions of $W_{A1}$ and $W_{A2}$ the sum of which is a total source boundary dimension of $W_A$. A medium-high gain transistor formed by gate area 365 between source region 312 and drain region 330 has a source boundary 384 of dimensions of $W_{B1}$ and $W_{B2}$ measured in the same way as for high gain gate area 373. Each medium-high gain gate area 365 and 367 have the same source boundary dimensions $W_{B1}$ and $W_{B1}$ the $W_{B1}$ the sum of which is a total source boundary dimension $W_B$. A medium-low gain transistor formed by gate area 364 between source region 312 and drain region 328 has a source boundary 386 of dimensions $W_{C1}$ and $W_{C2}$ measured in the same way as for gate areas 373 and 365. Each medium-low gain gate area 364, 369, and 375 have the same source boundary dimensions $W_{C1}$ and $W_{C2}$ the sum of which is a total source boundary dimension $W_C$.

A low gain transistor formed by gate 368 between source region 316 and drain region 328 has a source boundary 388 which is measured slightly differently than for other gain states. A portion 390 of gate area 368 is between oxide 354 and source region 316 which has a negligible effect as a gate. Accordingly, source boundary 388 has an effective dimension of $W_D$ between oxide 347 and 354 at their closest points.

Associated with each gain state is a source boundary dimension and a drain boundary dimension with the drain boundary dimension $W_L$ being the same for all the gain states as well as being greater than each of the four source boundary dimensions $W_A$, $W_B$, $W_C$, and $W_D$.

Due to the taper of the potential gate area $W_A$ is greater than $W_B$ which is greater than $W_C$ which is greater than $W_D$, partially accounting for the reduced gain. Each gain state has an effective gate width proportional to its associated source boundary dimension and the drain boundary dimension. An approximate effective gate width $W_{AE}$ for the high gain state is calculated as follows:

$$W_{AE} = \frac{3W_A + W_L}{4} \quad (5)$$

An approximate effective gate width $W_{BE}$ for the medium-high gain state is calculated as follows:

$$W_{BE} = \frac{3W_B + W_L}{4} \quad (6)$$

An approximate effective gate width $W_{CE}$ for the medium-low gain state is calculated as follows:

$$W_{CE} = \frac{3W_C + W_L}{4} \quad (7)$$

An approximate effective gate width $W_{DE}$ for the low gain state is calculated as follows:

$$W_{DE} = \frac{3W_D + W_L}{4} \quad (8)$$

Each gain state has a different gate length as well as a different gate width. A gate length $L_A$ for the high gain states is shown, for example, for gate area 374 bounded by source region 318 and drain region 334. Similarly, a gate length $L_B$ for the medium-high gain states, a gate length $L_C$ for the medium-low gain states, and a gate length $L_D$ for the low gain states are shown, for example, for gate areas 367, 369, and 370, respectively.

For a calculation of the gains of the gain states for comparative purposes, the effective width is divided by the length. Consequently, for the purpose of comparing the relative gains of the four gain states, the high gain state $W_AWE/L_A$, the the medium-low gain state $W_{CE}/L_D$, and the low gain state is desired by varying the lengths $L_A$, $L_B$, $L_C$, and $L_D$; width portions $W_{A1}$, $W_{A2}$, $W_{B1}$, $W_{B2}$, $W_{C1}$, $W_{C2}$, $W_{D1}$, $W_{D2}$, $W_{L1}$, and $W_{L2}$ for determining the effective gate widths, and angle B of the taper of the potentialgate area. In A ROM in which the high gain transistor is biased with a gate voltage of 3.9 volts and a source at essentially ground to produce a drain voltage at approximately 2.9 volts, for sense amplifier detection by a differential amplifier, the following are the dimensions (in microns), for example, for useful gain separation of the four gain states; $L_A=2.0$, $L_B=2.5$, $L_C=3.4$, $L_D=5.25$ $W_{A1}=3.10$, $W_{A2}=3.75$, $W_{B1}=2.75$, $W_{B2}=3.5$ $W_{C1}=2.35$, $W_{C2}=2.9$, $W_D=3.25$, $W_{L1}=4.2$, $W_{L2}=5.0$ The angle B of taper is, for example, 64°.

Shown in FIG. 4 is a cell array 400 which is substantially the same as array 310 of FIG. 3 except that only four transistor memory cells are shown, a high gain transistor 401, a high gain transistor 402, a medium-high gain transistor 403, and a medium-high gain transistor 404. Transistor 401 has a source in contact with a metal contact 406, and a drain in contact with a metal contact 407. Transistor 402 has a source in contact with metal contact 406 and a drain in contact with a metal contact 408. Transistor 403 has a source in contact with a metal contact 409, and a drain in contact with metal contact 408. Transistor 404 has a source in contact with metal contact 409, and a drain in contact with a metal contact 410. Contacts 407, 408 and 410 are for connecting drains of transistors 401–404 to bit sense lines. Contacts 406 and 409 are for connecting sources of transistors 401–404 to virtual ground lines. The gates of transistors 401–404 are formed by a polysilicon line 412 which is a word line of array 400. When word line 412 is a logic high then a pair of transistors along word line 412 will be selected by a virtual ground line switching to a logic low. For example, if the virtual ground line at contact 409 switches to a logic low, then transistors 403 and 404 are selected. Each of transistors 403 and 404 provide a voltage on the bit lines connected to contacts 408 and 410, respectively, which is sensed by a sense amplifier to determine the state of the sensed memory cells, transistors 403 and 404.

Transistors 403 and 404 have a different orientation, as do transistors 401 and 402. Because transistors 403 and 404 are selected as a pair by virtual ground contact 409, and transistors 401 and 402 are selected as a pair by virtual ground contact 406, then the orientation is stated in relation to the virtual ground which selects the transistor. Consequently, transistors 401 and 403 are said to have a "right" orientation and transistors 402 and 404 are said to have a left orientation.

Gate length dimensions of transistors 401–404 are determined by the width of polysilicon line 412. Gate width dimensions of transistors 401–404 are determined by oxide regions 414, 415, 416, 417 and 418, but also by the location of polysilicon line 412 in relation to oxide regions 414–418.

Right oriented transistors 401 and 403 have drain boundary dimensions of $W_{R1}$ and $W_{R2}$. Left oriented transistors 402 and 404 have drain boundary dimensions of $W_{L1}$ and $W_{L2}$. In FIG. 4 $W_{L1}$ equals $W_{R1}$ and $W_{R2}$ equals $W_{L2}$. This is the nominal case, but not necessarily typical because there is variation in the relationship of polysilicon 412 to oxide regions 414–418. This is due to mask to mask alignment variation. The masks which determine the location of oxide regions 414–418 is different than that which determines the location of polysilicon 412. These two masks experiences some alignment variation. Shown in FIG. 5 is array 400 in which polysilicon 412 is moved up and to the right, as indicated by arrow 419, in relation to oxide regions 414–418. In such case, $W_{L1}$ is no longer equal to $W_{R1}$. A 0.5 micron shift to the right results in $W_{R1}$ being 1.0 micron greater than $W_{L1}$. Although $W_{L2}$ becomes greater than $W_{R2}$, it is only by about 0.5 micron. Consequently, the gate width of transistor 401 is greater than that of transistor 402. Additionally, the gate shapes of transistors 401 and 402 are different because $W_{R1}$ has a different ratio to $W_{R2}$ than $W_{L1}$ has to $W_{L2}$. This results in transistors 401 and 402 providing different output voltages when selected even though transistors 401 and 402 have the same gain state.

Shown in FIG. 6 are reference cells 500 along a continuation of polysilicon line 412. Reference cells 500 comprises a reference transistor 501 and a reference transistor 502. Transistor 501 is a right oriented transistor. Transistor 502 is a left oriented transistor. Transistors 501 and 502 are reference transistors for establishing a reference voltage for aiding in the determination of the state of a selected memory cell. Because memory array 310 in FIG. 3 has transistors in four different gain states, three reference voltages are generated, one between the high gain state and the medium-high gain state, one between the medium-high and medium-low gain states, and one between the medium-low and low gain states. Transistors 501 and 502 are each for the reference between the high and medium gain states. Of the three references, transistors 501 and 502 have the shortest gate length and are called S references. Transistors for providing the reference between the low and medium low gain states have the longest gate length and are called L references. Transistors for providing the reference between the medium-low and medium-high gain states have a middle gate length and are called M references. The reference transistors are all N channel transistors.

Transistors 501 and 502 are needed for distinguishing between the high gain state and the medium-high gain state. Transistors 501 and 502 both have a gate length which is between that of high gain and medium-high gain state transistors. As for transistors 401–404, transistors 501 and 502 have gate widths determined by oxide regions. The oxide regions are an oxide region 503, 504, and 505. Oxide regions 503–505 are configured the same as analogous oxide regions in array 400 and array 310. Transistor has a drain in contact with a metal contact 506, and a source in contact with a metal contact 507. Transistor 502 has a drain in contact with a metal contact 508. Metal contact 507 is connected to a virtual ground line which, when switched to a logic low when polysilicon 412 is at a logic high, will select transistors 501 and 502.

Metal contacts 506 and 508 are connected to bit sense lines for providing the outputs of reference transistors 501 and 502 to a sense amplifier. Transistor 501 has drain boundary dimensions $W_{R1}$ and $W_{R2}$ which are the same as for transistors 401 and 403. Transistors 502 has drain boundary dimensions $W_{L1}$ and $W_{L2}$ which are the same as for transistors 402 and 404. As shown in FIG. 6, transistors 501 and 502 are formed by polysilicon 412 in the nominal relationship to oxide regions 503–505. In this nominal case $W_{L1}$ equals $W_{R1}$ and $W_{L2}$ equals $W_{R2}$. Also in this nominal case the output voltage supplied on contacts 506 and 508 when transistors 501 and 502 are selected will be the same.

In practice, however, there is in fact mask to mask alignment error. Shown in FIG. 7 are transistors 501 and 502 with polysilicon 412 shifted up and to the right in the same way as shown in FIG. 5 for transistors 401–404. With such a shift, dimensions $W_{L1}$, $W_{L2}$, $W_{R1}$ and $W_{R2}$ for transistors 501 and 502 change the same way as for transistors 401-404. Because each of the transistors 501 and 502 is intended to provide a voltage that is between that provided by high gain and medium-high gain state transistors, such as between transistors 401 and 403 and between transistors 402 and 404, it is desirable for the voltage provided by these transistors to shift as the voltages provided by transistors 401 and 404 shift. The magnitude of the shift in output voltage provided by transistors 401-404 is related to their orientation. Right oriented transistors 401 and 403 experience a different shift in output voltage than does left oriented transistors in going from the nominal case of FIG. 4 to the up and to the right shift of polysilicon 412 of FIG. 5. Transistors 501 and 502 provide reference voltage tracking for such a shift as indicated by arrow 419, so long as right oriented reference transistors are used for the needed reference voltages for a right oriented memory cell and left oriented reference transistors are used for the needed reference voltages for a left oriented memory cell, then the reference voltage will track the output voltage of the memory cells with mask to mask alignment variation.

For the case in FIG. 5 in which transistors 401 and 402 are selected, transistor 401 will provide a first voltage and transistor 402 will provide a second voltage which is greater than the first voltage. Transistor 502 has less gain than transistor 501 because it has less gate (or channel) width. Transistor 502 will then draw less current than transistor 501 which results in transistor 502 providing the higher voltage. The gain state of transistors 501 and 502 must be distinguished from the other gain states to which transistors 501 and 502 could have been programmed. In particular, the medium-high gain state must be distinguished because the medium-high gain state provides the output voltage which is closest to that of the high gain state. Transistors 403 and 404 show in which condition transistors 401 and 402 would be if transistors 401 and 402 were programmed to the medium-high gain state. Transistor 403 provides a third output voltage, and transistor 404 a fourth output voltage. The output voltage of transistor 404 is greater than that of transistor 403 for the same reason the output voltage of transistor 402 is greater than that of transistor 401. Transistor 501 provides an output voltage which is ensured of being the desired position between the first and third voltages. Transistor 502, likewise, provides an output which is ensured of being the desired position between the second and fourth voltage. Consequently, the output of transistor 501 is useful as a reference for determining the state of transistor 401. Transistor 502, likewise, is useful for determining the state of transistor 402.

Figure 8:
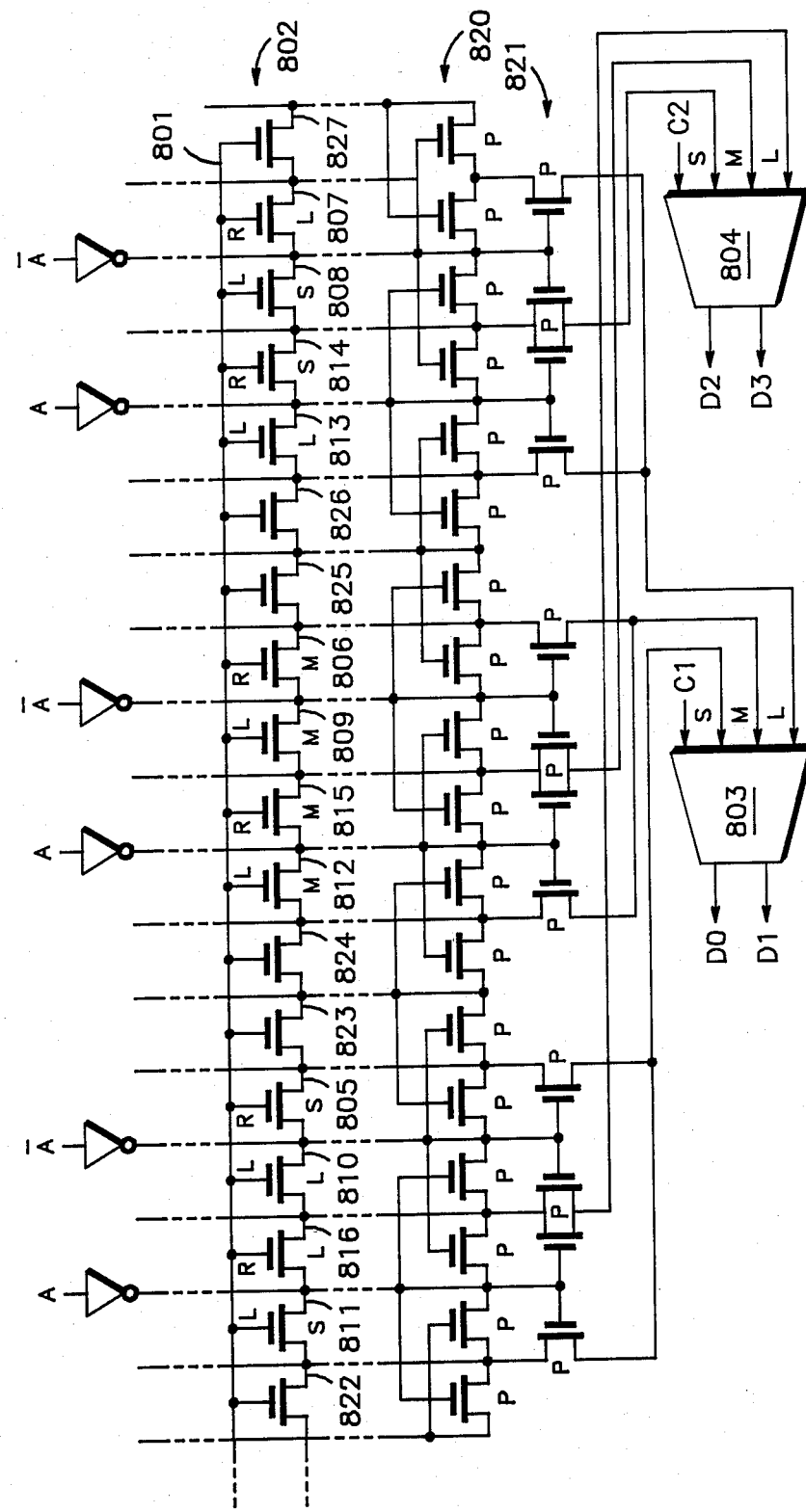
FIG. 8 is a circuit diagram for implementing reference transistor cells according to the invention.

Shown in FIG. 8 is a circuit 800 useful for implementing technique of having a reference cell have the same orientation of a selected cell. Circuit 800 includes a continuation of a word line 801 which is like word line 412 of FIGS. 4-7. Word line 801 has a plurality of transistors 802 connected to it. Twelve of these are for providing the S, L, and M references as indicated. There are four of each of these references. Circuit 800 includes a sense amplifier 803 and a sense amplifier 804 each of which receives an S, M, and L references each time a determination of a gain state of a selected cell is made. Sense amplifiers 803 and 804 each provide two Binary outputs because the cells are four state cells. Sense amplifiers 803 and 804 both receive left and right oriented S, M, and L reference depending upon whether the virtual ground line selected was odd or was even. Assuming for odd virtual ground lines that an input C1 to sense amplifier 803 is from a right oriented transistor memory cell and that an input C2 to sense amplifier 804 is from a left oriented transistor memory cell, then sense amplifier 803 receives references S, M, and L from right oriented transistors 805, 806, and 807, respectively, and sense amplifier 804 receives references S, M, and L from left oriented transistors 808, 809, and 810, respectively, as selected by virtue of a predetermined address signal A being a logic low and its complement being a logic high. Conversely, for even virtual ground lines, input C1 is from a left oriented transistor and input C2 is from a right oriented transistor, in which case, sense amplifier 803 receives the S, M, and L references from left oriented transistors 811, 812, and 813, respectively, and sense amplifier 804 receives the S, M, and L references from right oriented transistors 814, 815, and 816 selected in response to signal A being a logic high. Signal A is a logic high and its complement is a logic low when an even virtual ground line is selected. Signal A is a logic low and its complement a logic high when an odd virtual ground is selected.

A plurality of P channel transistors 820 are used as loads. Although other loading schemes could also be used, the one shown is believed to have advantages which are described in U.S. patent application Ser. No. 646,725, entitled "Circuit For Reducing Degradation of Voltage Differential In a Memory". A plurality P channel transistors 821 are used as select transistors. Transistors 822, 823, 824, 825, 826 and 827 are used to maintain symmetry and isolation.

Circuit 800 is thus effective for using commonly oriented transistor memory cells and transistor reference cells in determining the state of a four state cell. There are two state ROMs which also have varying cell orientation. Memory array 310 uses the X-cell formation, but the X-cell formation has also been used for ROMs which have two state cells. In such a ROM there are also right and left cell orientations to which it may be advantageous to have right and left reference cells as well. Consequently, there may well be other embodiments of the invention than shown by the applicant.

What is claimed:

1. A memory, comprising:
a first transistor memory cell having a first orientation, programmable to one of at least two states, and providing an output;
a second transistor memory cell having a second orientation, programmable to one of the at least two states, and providing an output;
a first reference transistor having the first orientation, programmed to a first reference state, and providing an output;
a second reference transistor having the second orientation, programmed to the first reference state, and providing an output;
first sense amplifier means, coupled to the first transistor memory cell and the first reference transistor, for providing an output indicative of the state of the first transistor memory cell; and
second sense amplifier means, coupled to the second transistor memory cell and the second reference transistor, for providing an output indicative of the state of the second transistor memory cell.

2. The memory of claim 1, wherein the first and second transistor memory cells are each programmable to one of four states, further comprising:

a third reference transistor having the first orientation, programmed to a second reference state, and having an output coupled to the first sense amplifier means;

a fourth reference transistor having the second orientation, programmed to the second reference state, and having an output coupled to the second sense amplifier;

a fifth reference transistor having the first orientation, programmed to a third reference state, and having an output coupled to the first sense amplifier; and a sixth reference transistor having the second orientation, programmed to the third reference state, and having an output coupled to the second sense amplifier means.

3. The memory of claim 2 wherein the first and second transistor memory cells and the first, second, third, fourth, fifth, and sixth reference transistors each have an input for receiving an enable signal.

4. The memory of claim 3 further comprising a word line connected to the inputs of the first and second transistor memory cells and the first, second, third, fourth, fifth, and sixth reference transistors, and for carrying the enable signal.

5. The memory of claim 4 further comprising a plurality of virtual ground lines for selecting memory cells and reference transistors.

6. The memory of claim 5 wherein the first and second transistor memory cells and the first, second, third, fourth fifth and the sixth reference transistors each have a third terminal coupled to a corresponding virtual ground line.

7. The memory of claim 6 wherein the output of the first transistor memory cell and the first, third, and fifth reference transistors are coupled to the first sense amplifier means when the corresponding virtual ground lines are switched to a predetermined logic state and the enable signal is present.

8. A memory, comprising:
a first memory cell having a first orientation and for providing an output voltage at a first level when programmed to a first logic state and at a second level when programmed to a second logic state;

a second memory having a second orientation and for providing an output voltage at a third level when programmed to a first logic state and at a fourth level when programmed to second logic state;

a first reference cell having the first orientation and for providing a first reference voltage level which is between the first level and the second level;

a second reference cell having the second orientation and for providing a second reference voltage which is between the third level and the fourth level;

first sense amplifier means, coupled to the first memory cell and the first reference voltage, for providing an output voltage indicative of the state of the first memory cell; and second sense amplifier means, coupled to the second memory cell and the second reference cell, for providing an output voltage indicative of the state of the second memory cell.

9. The memory of claim 8 wherein the first and second memory cells and the first and second reference cells each have an input for receiving an enable signal.

10. The memory of claim 9 further comprising a word line connected to the inputs of the first and second memory cells and the first and second reference cells and for carrying the enable signal.

11. In a memory having memory cells with first and second orientation, and which provide outputs when selected, a method comprising the steps of:
providing a first reference cell which has the first orientation and which provides an output;
providing a second reference cell which has the second orientation and which provides an output; and
comparing the outputs of a selected memory cell to the output of the first reference cell when the selected cell has the first orientation.

12. The method of claim 11 further comprising the step of:
comparing the output of a selected memory cell to the output of the second reference cell when the selected cell has the second orientation.

* * * * *

UNITED STATES PATENT AND TRADEMARK OFFICE
CERTIFICATE OF CORRECTION

PATENT NO. : 4,636,979

DATED : January 13, 1987

INVENTOR(S) : William J. Donoghue

It is certified that error appears in the above-identified patent and that said Letters Patent is hereby corrected as shown below:

Column 12, line 3, insert --cell-- after "memory".

Signed and Sealed this

Fourteenth Day of April, 1987

Attest:

DONALD J. QUIGG

Attesting Officer

Commissioner of Patents and Trademarks